United States Patent [19]

Jove et al.

[11] Patent Number: 4,786,993
[45] Date of Patent: Nov. 22, 1988

[54] VOLTAGE AMPLIFIER FOR CONSTANT VOLTAGE BIASING AND AMPLIFYING SIGNALS FROM A MR SENSOR

[75] Inventors: Stephen A. Jove, Watsonville; Klaas B. Klaassen, San Jose; Calvin S. Nomura, San Jose; Jacobus C. L. Van Peppen, San Jose, all of Calif.

[73] Assignee: International Business Machines Corporation, Armonk, N.Y.

[21] Appl. No.: 880,419

[22] Filed: Jun. 30, 1986

[51] Int. Cl.⁴ .......................... G11B 5/02; G11B 5/127
[52] U.S. Cl. ........................................ 360/67; 360/113
[58] Field of Search ............... 360/67, 113, 66; 324/249, 252; 330/60

[56] References Cited

U.S. PATENT DOCUMENTS

| | | | |
|---|---|---|---|
| 3,979,775 | 9/1976 | Schwarz | 360/113 |
| 4,050,086 | 9/1977 | Harr | 360/66 |
| 4,191,977 | 3/1980 | Lewkowicz | 360/66 |
| 4,677,380 | 6/1987 | Popovic et al. | 324/252 |
| 4,691,259 | 9/1987 | Imakoshi et al. | 360/67 |
| 4,694,248 | 9/1987 | Kordi et al. | 324/252 |
| 4,706,138 | 11/1987 | Jove et al. | 360/113 |

Primary Examiner—Raymond F. Cardillo
Assistant Examiner—Surinder Sachar
Attorney, Agent, or Firm—F. David LaRiviere; Henry E. Otto, Jr.

[57] ABSTRACT

An amplifier for voltage biasing and amplifying the signals produced by a magnetic sensor is provided. Electrically, the resistance of the sensor is disposed between the bases of a differential pair comprising the input stage of the amplifier. Constant bias voltage for the sensor is provided independently of sensor resistance. DC feedback to the input stage balances current flow in both paths of the differential input stage to correct for DC offset arising in the output from input stage emitter resistor. The amplified signal, representing $\Delta R_h/R_h$, is sensed as a voltage across the magnetoresistive sensor, where $\Delta R_h$ is the change in steady-state resistance, $R_h$, of the sensor.

20 Claims, 8 Drawing Sheets

VOLTAGE AMPLIFIER FOR CONSTANT VOLTAGE BIASING AND AMPLIFYING SIGNALS FROM A MR SENSOR

CROSS-REFERENCE TO RELATED APPLICATION

The present invention is related to the invention described in the U.S. patent application entitled, "Method and Apparatus for Reading Recorded Data by a Magnetoresistive Head", Ser. No. 767,549 filed Aug. 20, 1985 by Klaas B. Klaassen (now U.S. Pat. No. 4,712,144) and assigned to the assignee hereof, and is incorporated by reference as if fully set forth herein (hereafter reference 1). The present invention is also related to the invention described in the U. S. patent application entitled, "Amplification of Signals Produced by Magnetic Sensor", Ser. No. 851,649, filed by S. Jove, et al, (now U.S. Pat. No. 4,706,138) and assigned to the assignee hereof, and is incorporated by reference as if fully set forth herein (hereafter reference 2).

BACKGROUND OF THE INVENTION

Most existing magnetoresistive (MR) sensors, including particularly sensors for bubble memories and magnetic recording, are biased at a constant bias current by preamplifiers which detect the signal voltage developed at the sensor terminals. Since stripe height is inversely proportional to sensor resistance, and varies from sensor to sensor owing to production variations and varies over the life of the sensor in contact recording applications owing to wear, it is desirable to detect signals produced by the sensor which are independent of stripe height. Thus, as shown in the related application, it is desirable to detect and amplify a voltage or a current representing $\Delta R_h/R_h$, where $\Delta R_h$ is the change in MR sensor resistance, $R_h$, arising from the magnetic input signal from the media being read.

In the second of the related applications cross-referenced above, a transimpedance amplifier for biasing a magnetoresistive sensor with a current having a constant time average value, and for amplifying deviations from said constant value produced by changes in the steady-state value of sensor resistance, is described. DC feedback is used to balance the current flow in both paths of a differential input stage to correct for DC offset voltage which can otherwise develop at the output.

SUMMARY OF THE INVENTION

According to the present invention, two embodiments of an enhanced voltage amplifier may be used for constant voltage biasing and amplifying the signals produced by an MR sensor. In both circuits, the differential input stage has built-in offset correction derived from emitter resistors and a high impedance current source. The circuits differ in configuration of the transconductive feedback employed to minimize the DC error signal at the amplifier output.

Electrically, the resistance, $R_h$, of the MR sensor is disposed between the bases of a differential pair comprising the input stage of the amplifier. The voltage which biases the MR sensor is held constant because it is provided independently of sensor resistance as the product of the input stage emitter resistor and one-half of the current from a constant current source.

In the circuit configurations of the present invention, the signal representing $\Delta R_h/R_h$ is sensed as a time-varying voltage across the MR sensor. The steady-state value of $R_h$ refers to the resistance value of $R_h$ while biased but not sensing magnetic field variations.

The input stage of the amplifier of the present invention may be replicated as many times as there are MR sensors in a given system. The remaining components of the amplifier comprise the output and feedback stages which are common to all, and switched among, the input stages in a multiple-head system. Additional circuitry may be added to shorten setting time when MR sensors are activated and deactivated in a multiple sensor system.

DESCRIPTION OF THE PREFERRED EMBODIMENT

Figure 1B:
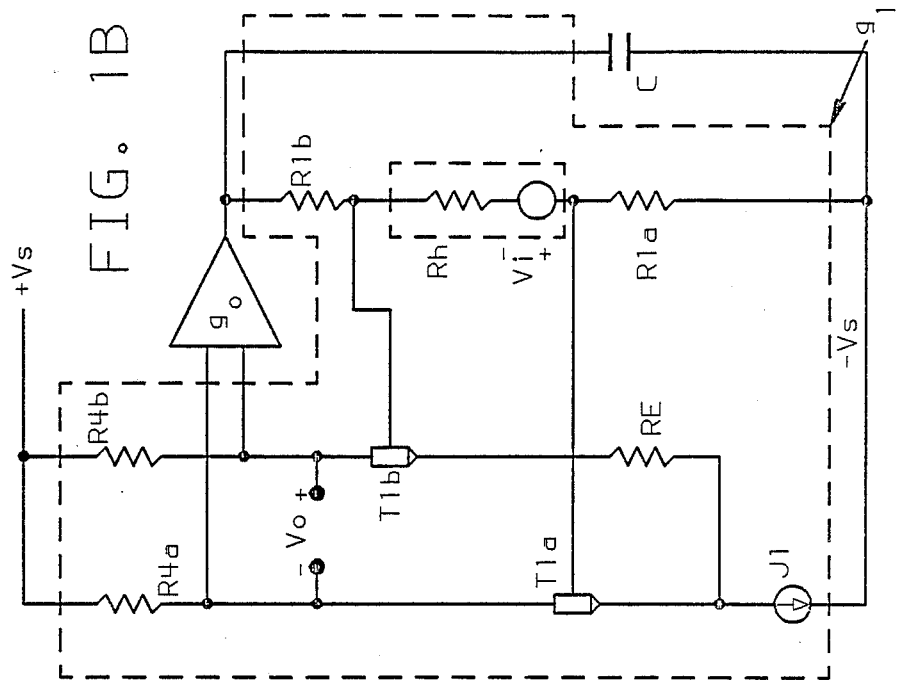
Figs. 1A and 1B are block diagrams of the basic concept of an amplifier constructed according to the principles of the present invention.
Figure 1A:
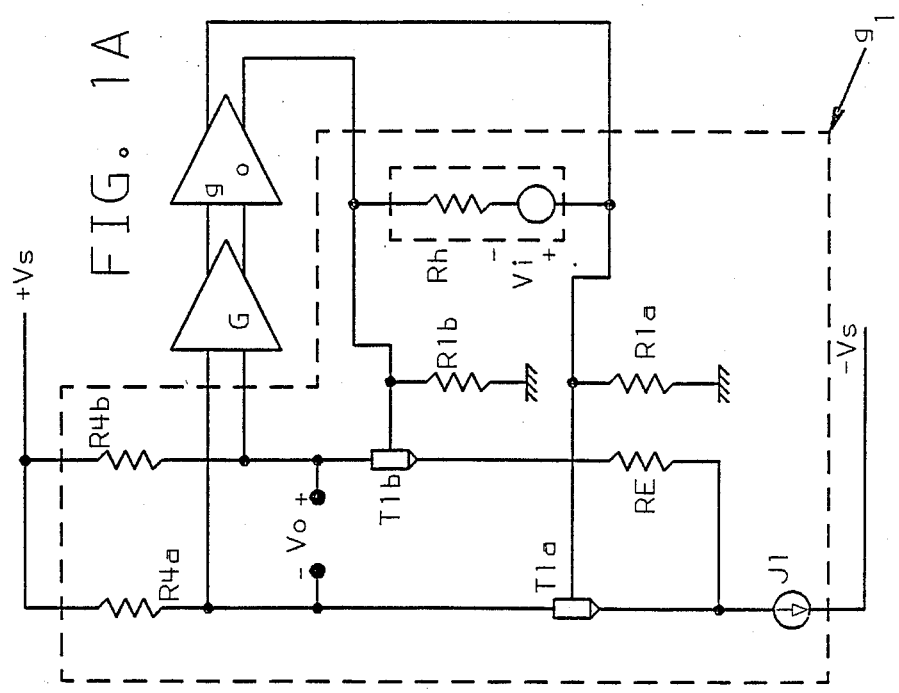

Referring first to FIGS. 1A and 1B, transistors T1a and T1b comprise a differential input amplifier stage having built-in offset emitter resistor RE. Since J1 is a high input impedance current source, this input stage provides true differential signal processing for AC signals. DC and low frequency error at the output, namely at R4a and R4b, is minimized by feedback circuits in both configurations. The magnetoresistive sensor, shown as an equivalent circuit comprising resistor $R_h$ and voltage source $V_i$, is coupled between the bases of transistors T1a and T1b.

In the configurations of FIGS. 1A and 1B, the output of the feedback stage, $g_0$, is a current and the input to the feedback is a voltage. Thus, the feedback amplifier $g_0$ is a transconductance amplifier. An RC network is incorporated into amplifier G in FIG. 1A to provide a dominant pole to separate low frequency error signals from high frequency information signals. The error signal is subtracted from the information signal, $V_i$, at the bases of transistors T1a and T1b.

When the error signal is minimized, current from current source J1 is divided equally through transistors T1a and T1b to create a voltage reference, $V_{re}$, across emitter resistor RE equal to the product of RE and one-half of the current supplied by current source J1. Thus, $V_{re}$ appears between the bases of transistors T1a and T1b and is therefore the voltage which biases MR sensor, $R_h$, independent of the resistance value thereof.

In the configuration of FIG. 1A, differential voltage gain stage G couples the input differential stage transistors T1a and T1b to the transconductance amplifier $g_0$.

In addition, as described elsewhere in this specification, gain stage G provides a dominant pole for control of low frequency error signals. The DC voltage across sensor $R_h$ is kept constant independent of the value of $R_h$ by controlling the current therethrough. The configuration of FIG. 1A provides a ground potential at the common connection of input resistors $R1a$ and $R1b$ which becomes the average potential of the MR sensor. If the average potential of the sensor is ground, corrosion and electrostatic discharge is reduced, and reliability of the sensor is enhanced. However, the average potential of the MR sensor could also be placed at any desired voltage with this circuit.

In the configuration of FIG. 1B, transconductance amplifier $g_0$ comprises a single-ended, push-pull feedback stage with a capacitor at the output. The current through sensor $R_h$ is controlled in the same manner as described for the configuration of FIG. 1A. Resistors $R1a$ and $R1b$ determine the amplifier input impedance and act as part of the RC network in a resistor divider configuration with sensor $R_h$. In the configuration of FIG. 1B, capacitor C also reduces noise associated with amplifier $g_0$ at information signal frequencies.

Figure 2:
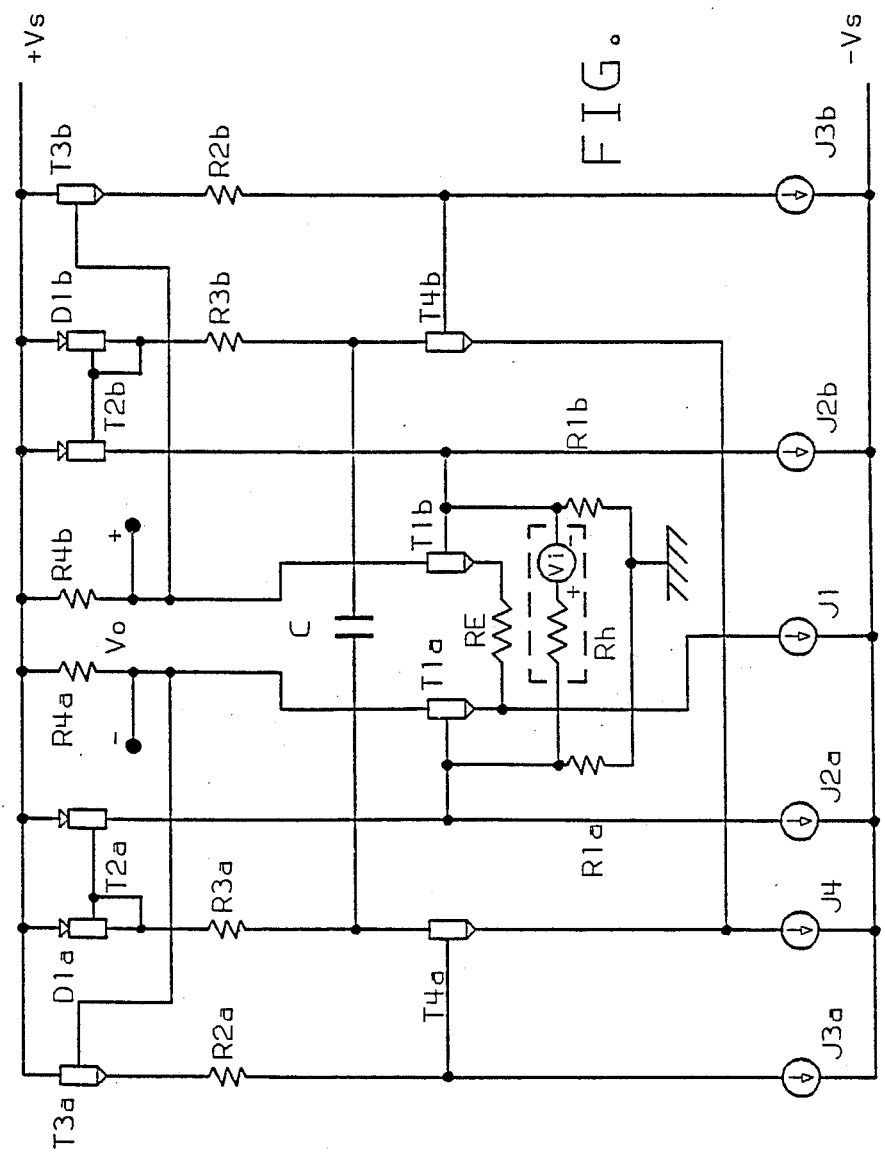
FIG. 2 is a circuit diagram of an amplifier implemented according to FIG. 1A.

Referring now to FIG. 2 with continuing reference to FIG. 1A, amplifier G comprises a differential voltage follower and the input to transconductance stage $g_0$. Differential voltage follower includes transistors $T3a$ and $T3b$ resistors $R2a$ and $R2b$ and current sources $J3a$ and $J3b$.

The input portion to the transconductance stage includes transistors $T4a$ and $T4b$, resistors $R3a$ and $R3b$, capacitor C, and current source $J4$. The remainder of the transconductance stage, $g_0$, is a current mirror comprising transistors, $D1a$ and $D1b$, $T2a$ and $T2b$, and current sources $J2a$ and $J2b$.

The general voltage gain transfer function of the entire amplifier is given by $$A = \frac{V_o}{V_i} = \frac{\left[s + \frac{1}{2CR_3}\right]\left[\frac{2R_4}{\frac{2R_b + R_h}{B} + RE + 2rE}\right]}{s + \frac{1}{2CR_3}\left[1 + \frac{R_4 R_h B}{\left[\frac{2R_b + R_h}{B} + RE + 2rE\right][rb + B\,re]}\right]} \quad \text{Equation (1)}$$

for $R_1 >> R_h$ and $f_t >> f_{pole}$.

The terms for Equation (1) are defined as follows:
  $R_b$ = series base resistance of $T_1$
  B = forward current gain
  $rE = (kT/q\,Ic_1)$
  rb = series base resistance of $T_4$ (includes R2)
  $re = (kT/q\,Ic_4)$
  $f_t$ = device transition frequency
  $f_{pole}$ = dominant pole frequency
  $R_h$ = MR head resistance (steady-state value)
  $Ic_1$ = collector current of $T_1$
  $Ic_4$ = collector current of $T_4$
  k = Boltzmann's constant
  T = absolute temperature
  q = electron charge The voltage gain transfer function at high frequencies is given by:

$$A_i = \frac{2R_4}{RE + 2rE + \frac{2R_b + R_h}{B}} \quad \text{for } f >> (1/(4\pi C R_3)) \quad \text{Equation (2)}$$

The voltage gain transfer function at low frequencies is given by:

$$A_z = \quad \text{Equation (3)}$$

$$A\Big|_{s=0} = \frac{2R_4(rb + B\,re)}{\left[\frac{2R_b + R_h}{B} + RE + 2rE\right][rb + B\,re] + B R_4 R_h}$$

Transfer functions (1), (2) and (3) are approximate in that they do not consider the transition frequency of transistors nor transistor forward current gain variations. The amplifier has a high pass frequency characteristic.

Figure 3:
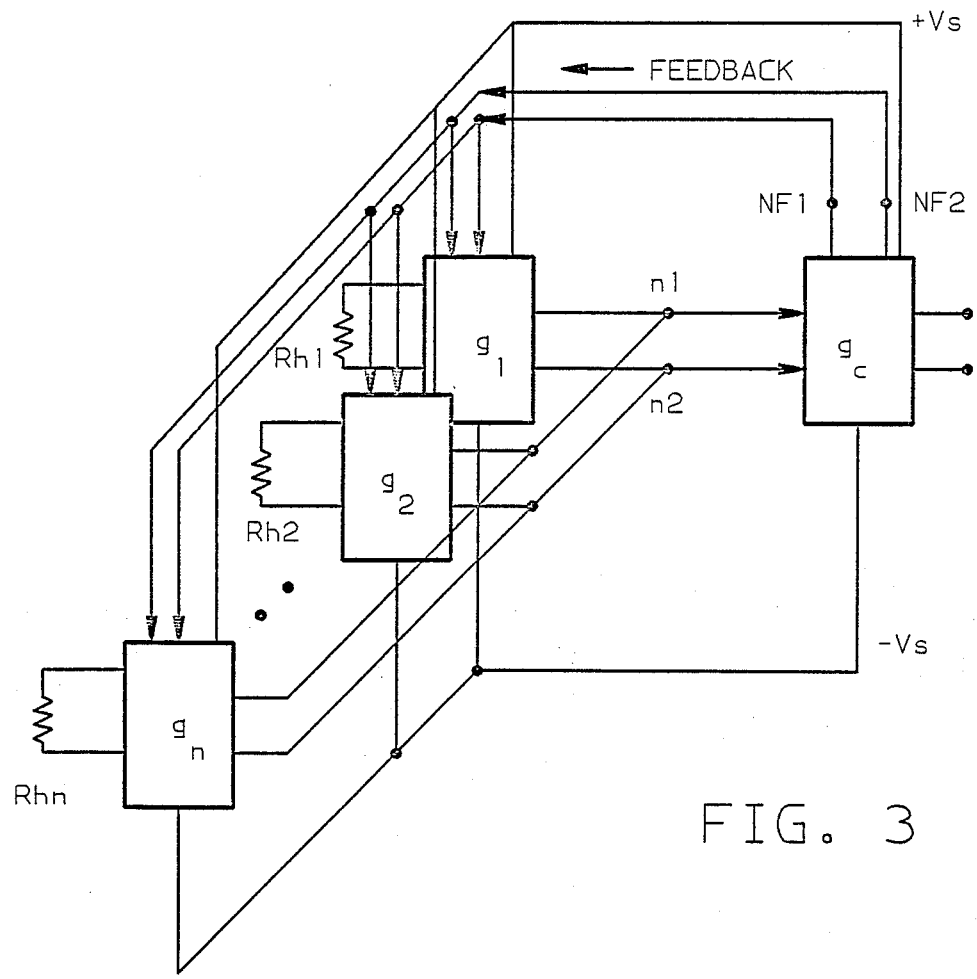
FIG. 3 is a block diagram which shows the coupling of selectable input stages to the common stage of the amplifier.

In order to facilitate switching from one MR sensor to another in a multiple sensor system, the circuit of FIG. 2 may be separated into a number of selectable input stages, $g_1, g_2, \ldots g_n$, each of which is dedicated to one MR sensor. Such input stages are coupled to a common stage, $g_c$, as shown in FIG. 3.

Figure 4:
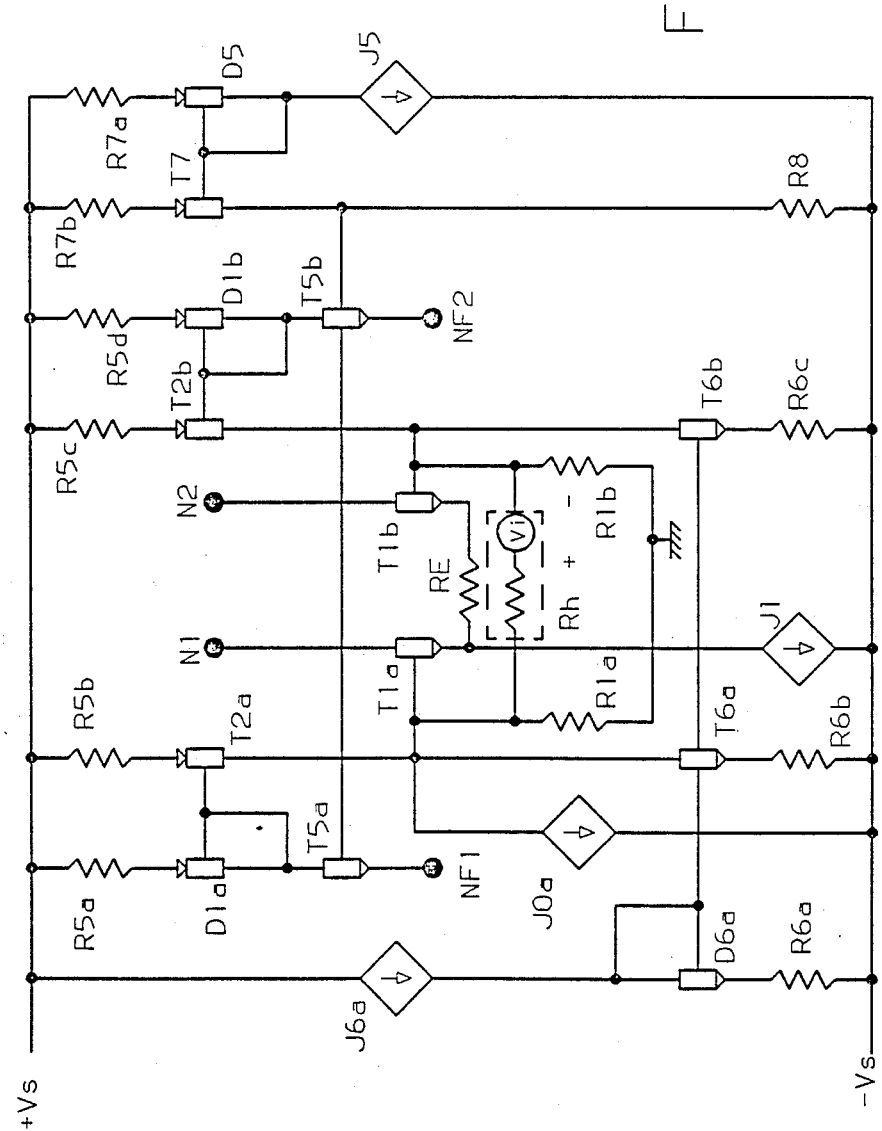
FIG. 4 is a circuit diagram for the selectable input stages of the amplifier of FIG. 3.
Figure 5:
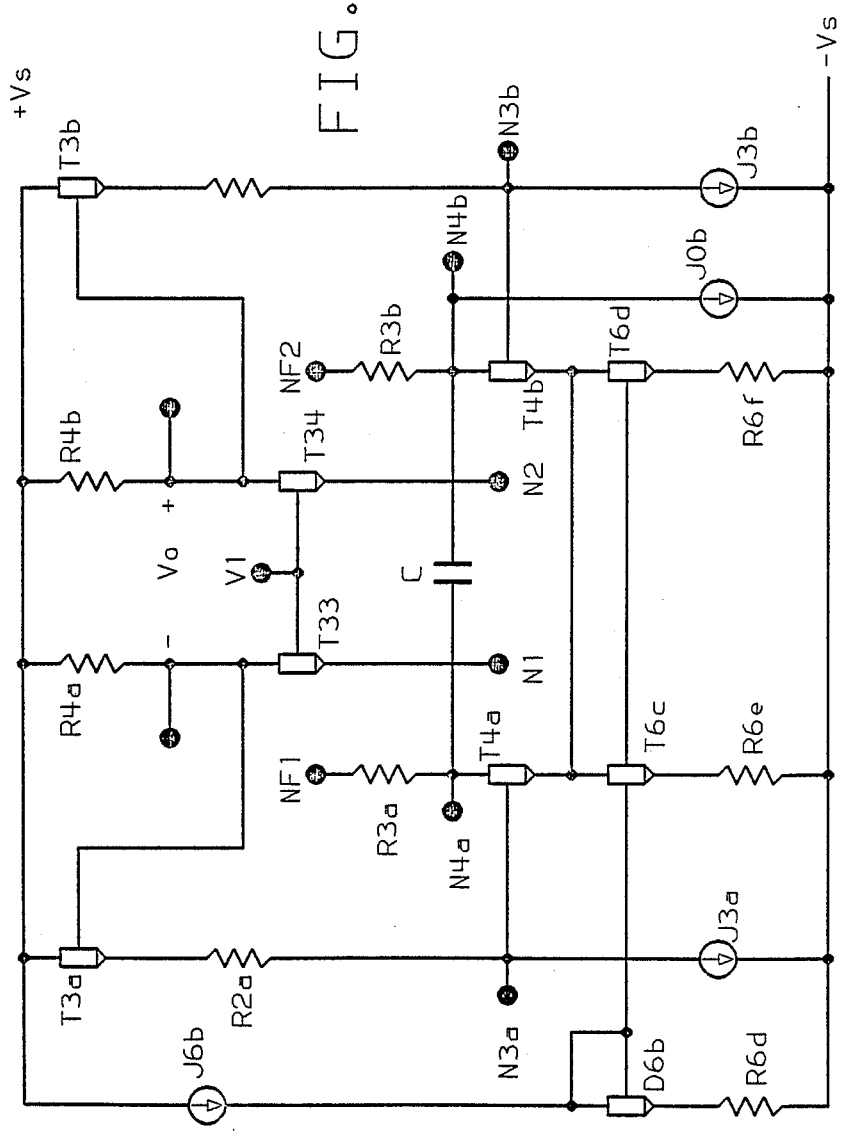
FIG. 5 is a circuit diagram for the common stage of the amplifier of FIG. 3.

Referring to FIGS. 4 and 5, input stages $g_1$ through $g_n$ are coupled to common stage, $g_c$, at nodes N1, N2, NF1 and NF2. Transistors T33 and T34 are coupled in cascode to extend the high frequency response when several input stages are coupled to the common stage.

Common stage $g_0$ comprises the voltage follower stage and the input to the transconductance stage of FIG. 2. The RC network to form the dominant pole is located in common stage, $g_0$, to reduce the number of capacitors required. The RC network comprises capacitor C and resistors R3a and R3b. If resistors R5a, R5b, R5c and R5d in FIG. 4 are equal and resistors are R6a, R6b, R6c, R6d R6e and R6f are equal, then the transconductance gain will be the same as the gain for the amplifier of FIG. 2 if the emitter area ratios of transistors D1a, D1b, T2a, T2b, D6a and D6b, T6a, T6b, T6c and T6d are equal and current source J6 equals current source J4.

To select a desired input stage $g_1$, current sources JOA, J1, J5 and J6a must be simultaneously activated. The deselected input stage is similarly deactivated by deactivating corresponding current sources. Transistors T6a and T6b correspond to current sources J2a and J2b of FIG. 2. Current source J5, resistor R8 and transistors D5, T5a, T5b and T7 are included to select the appropriate current mirrors as different MR sensors are activated.

According to the present invention, feed forward control is used to minimize the DC offset at the output of the common stage while preserving low frequency steady-state bandwidths. Referring to FIGS. 4 and 5, current from current source J0b is mirrored by the current mirror comprising D16 and T2b and flows into one terminal of $R_h$ while current from current source J0a is drawn from the other terminal of $R_h$. Thus, an offset current is provided through $R_h$ whose optimum value is given by $$V_{odc}=A_z[(J_1/2)RE-J0\,Rh] \quad \text{Equation (4)}$$

where $J0=J_1RE/2R_h$.

With continuing reference to FIGS. 4 and 5, the current provided by current sources J6a and J6b are equal during steady-state operation of the circuit. These currents may be temporarily increased during switchover, that is, when activating and deactivating input stages. To control and reduce transient settling time of the circuit, the currents from J6a and J6b are controlled by an added control line to change the value of the current at the moment of switchover. Thereafter, the sources may be returned to their original value after transients have been given a chance to settle. By increasing the current available from current sources J6a and J6b, the current available to charge or discharge capacitor C is thereby temporarily increased and loop gain of the circuit is correspondingly increased.

Figure 7A:
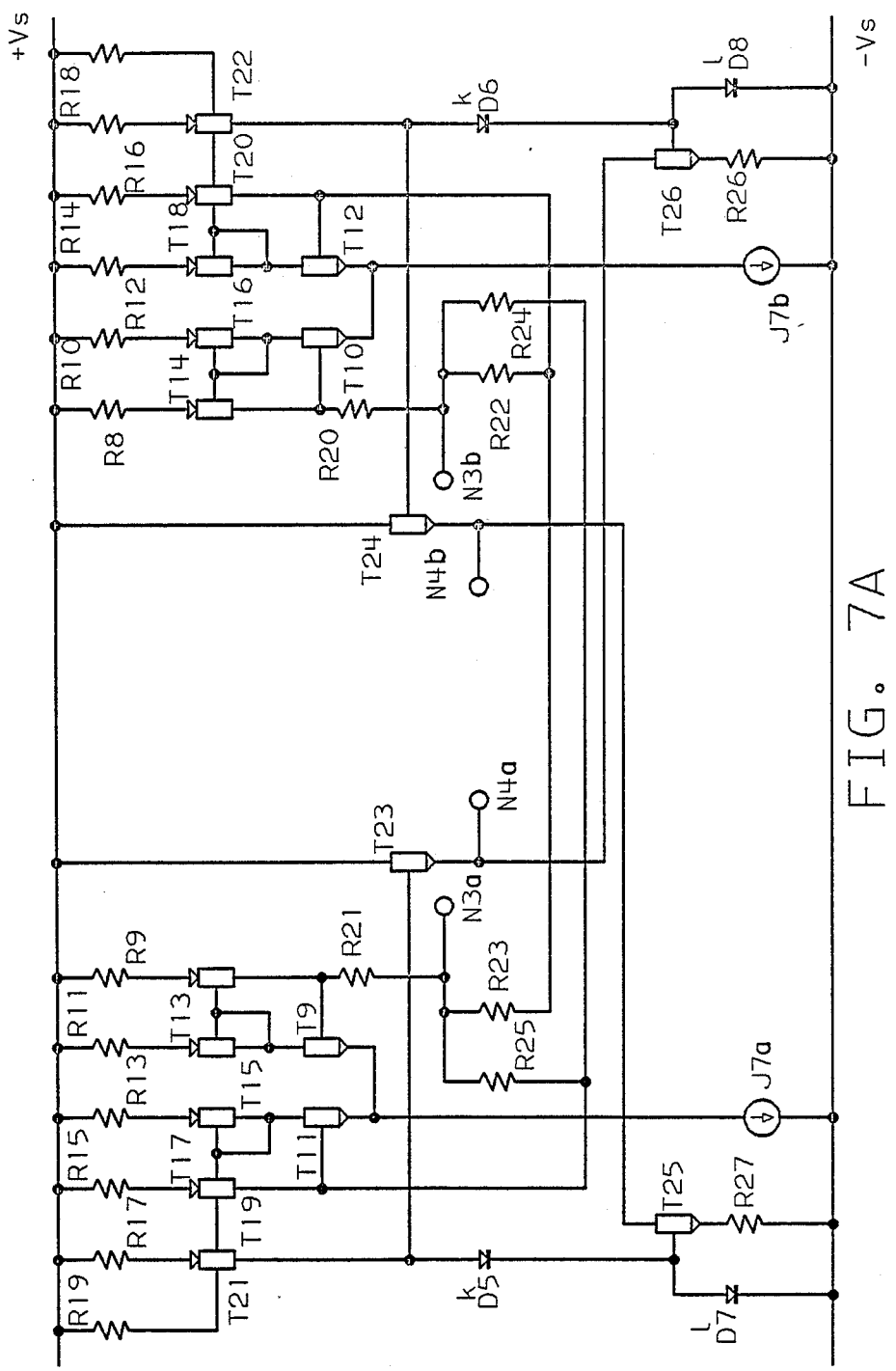
FIG. 7A and 7B are circuit diagrams of enhancements for reducing the settling time of the amplifiers of FIGS. 5 and 6 when MR sensors are activated and deactivated in a multiple-sensor system.

Alternatively switchover transient recovery can be controlled by using the feedback circuit configuration of FIG. 7A. Operation of the circuit of FIG. 7A is described in reference 2. Please note, nodes N3a, N3b, N4a, and N4b, are coupled to the corresponding nodes of the common stage of FIG. 5.

Figure 6:
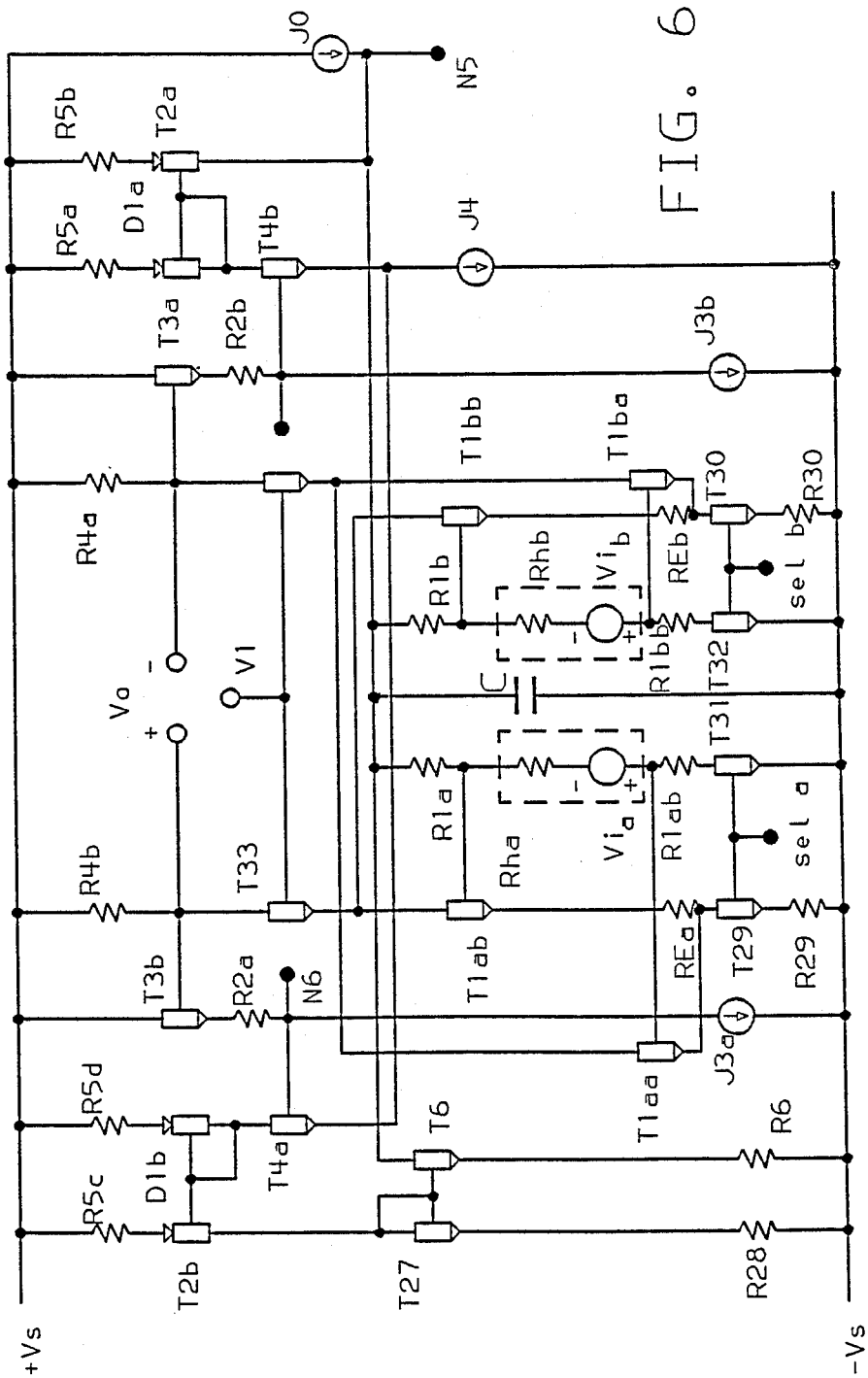
FIG. 6 is a circuit diagram of an amplifier implemented according to FIG. 1B.

The configuration of FIG. 1B is implemented according to the circuit of FIG. 6 wherein two selectable input stages are shown. Block g₀ consists of a differential voltage follower and a push-pull transconductance stage. The differential voltage follower consists of transistors T3a and T3b, resistors R2a and R2b and current sources J3a and J3b. The push-pull transconductance stage comprises an input stage and left and right current mirrors. The input stage includes transistors T4a and T4b and current source J4. The left current mirror includes transistors D1b, T2b, T27, T6 and resistors R5c, R5d, R6 and R28. The right current mirror consists of transistors D1 and T2 and resistors R5a and R5b.

The resistor divider network of FIG. 1B is selectable in the circuit of FIG. 6. The output of the transconductance amplifier at node 5 is also the common connection for the multiple resistor divider networks. The desired divider network is selected simultaneously with selection of the desired sensor/input-amplifier combination. Thus, for example, if sensor $R_{ha}$ is desired, transistors T29 and T31 are activated simultaneously by applying the appropriate control signal at control node "sel a", which simultaneously selects the desired divider network and sensor/input-amplifier, respectively. Similarly, if sensor $R_{hb}$ is desired, an appropriate control signal is applied at control node "sel b". For the circuit configuration shown, the control signal applied at either inut node is a negative voltage.

The general voltage gain transfer function of the amplifier of FIG. 6 is given by $$A = \frac{V_o}{V_i} = \frac{\left[s + \frac{1}{2CR_1}\right]\left[\frac{2R_4}{\frac{2Rb+Rh}{B}+RE+2rE}\right]}{s + \frac{1}{2CR_1}\left[1+\frac{2R_4R_hB}{\left[\frac{2Rb+Rh}{B}+RE+2rE\right][rb+B\,re]}\right]} \quad \text{Equation (5)}$$

for $f_t >> f_{pole}$ where terms for Equation (5) are defined elsewhere in the specification.

voltage gain transfer function at high frequencies for the circuit of FIG. 6 is given by $$a_i = \frac{2R_4}{\frac{2Rb+Rh}{B}+RE+2rE} \quad \text{for } f >> (1/(4\pi C R_1)) \quad \text{Equation (6)}$$

Voltage gain transfer function at low frequencies for the circuit of FIG. 6 is given by $$A_z = \quad \text{Equation (7)}$$

$$A\bigg|_s = \frac{2R_4(rb+B\,re)}{0\left[\frac{2Rb+Rh}{B}+RE+2rE\right][rb+B\,re]+2BR_4R_h}$$

Transfer functions (5), (6) and (7) are approximate in that they do not consider the transition frequency of transistors nor transistor forward current gain variations. The amplifier of FIG. 6 also has a high pass frequency characteristic.

As in the circuit configuration of FIGS. 4 and 5, feed-forward control is used to minimize DC offset at the output. Current source J0 supplies an offset current through the activated $R_h$. The optimum value of such offset current may be estimated by the relation $$V_{odc}=A_z[(I_{c30}/2)RE-J0\,Rh] \quad \text{Equation (8)}$$

where $JO=I_{c30}RE/2Rh$ where $I_{c30}=$collector current of $T_{30}$.

Figure 7B:
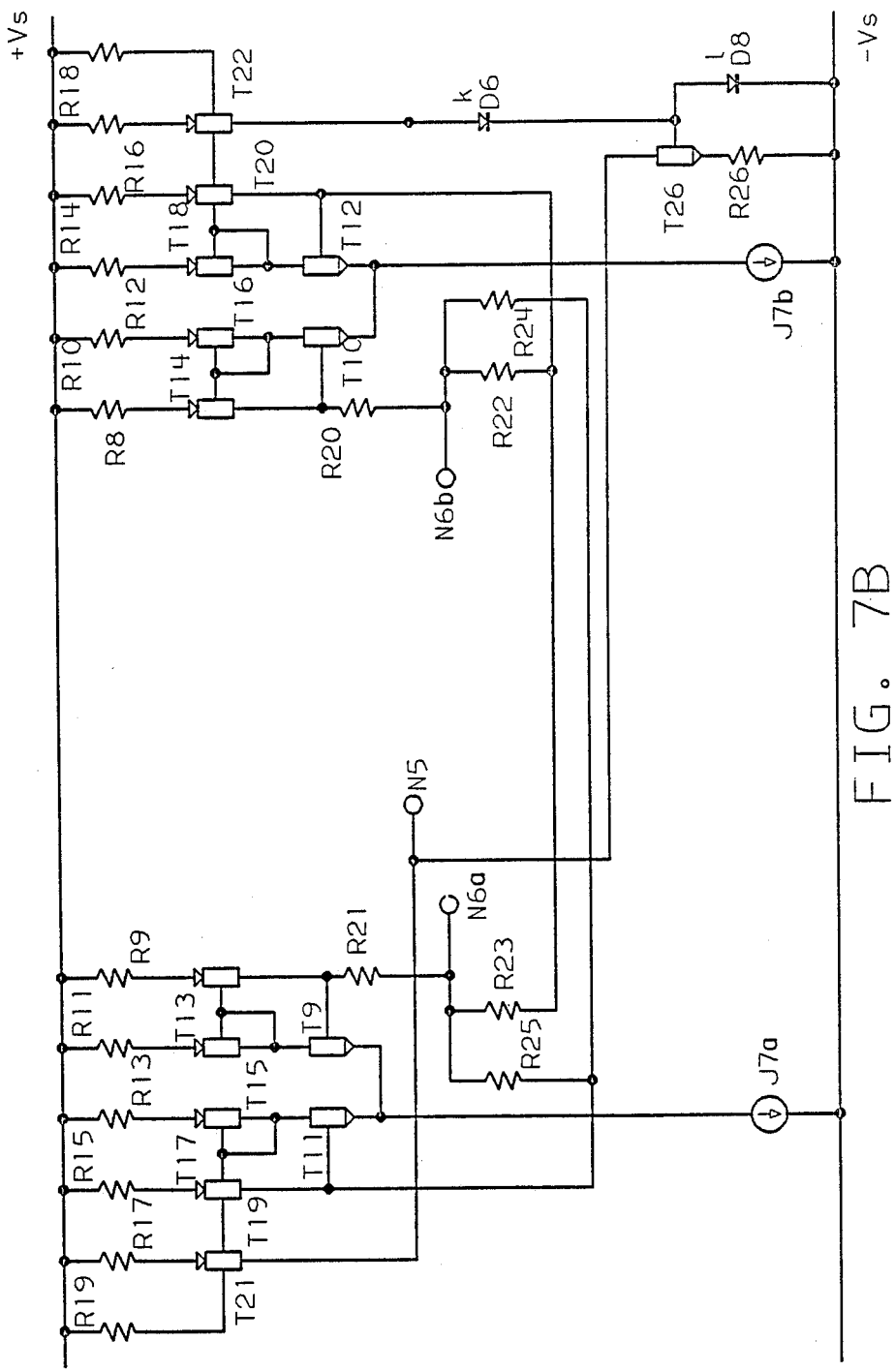

In a manner similar to that for the circuit configuration of FIGS. 4 and 5, the transconductance amplifier gain and the current available to charge or discharge capacitor C can be increased to control switchover transient settling time of the circuit. The increase of gain and charge or discharge current is provided in the same manner as previously described for the circuit configurations of FIGS. 4 and 5. Alternatively, switchover transient recovery time can be controlled by using the circuit of FIG. 7B, the operation of which is described in reference 2. Nodes 5, 6A and 6B are identified to indicate connection of this circuit at correspondingly identified nodes of the circuit of FIG. 6.

What is claimed is:

1. A circuit for simultaneously biasing and amplifying signals produced by a magnetoresistive sensor, said circuit comprising:
   a magnetoresistive sensor having a steady-state resistance value;
   a bias means to provide across said sensor a bias voltage having constant time average value;
   an input stage, having at least two transistors coupled in differential pair configuration and having the magnetoresistive sensor coupled between the bases of said pair of transistors, for amplifying voltage deviations from said constant time average value of the voltage across the magnetoresistive sensor; and
   an output stage, coupled to the input stage, for amplifying and transmitting signals received therefrom.

2. A circuit as in claim 1 wherein the signals amplified by said circuit are proportional to the relation $\Delta R_h/R_h$, where $\Delta R_h$ is the change in steady-state resistance, $R_h$, of the magneto-resistive sensor.

3. A circuit as in claim 1 further including:
a plurality of input stages; and
selection means for activating one of the plurality of input stages and deactivating all of the remaining plurality of input stages.

4. A circuit as in claim 2 further including means for feeding forward signals to minimize DC offset voltage at the output of the output stage.

5. Apparatus as in claim 3 wherein said selection means is effective for deactivating all of said input stages.

6. A circuit having a first constant current source for simultaneously biasing, and amplifying signals produced by, a magnetoresistive sensor having a steady-state resistance value, said circuit comprising:
a bias voltage for the magnetoresistive sensor having constant time average value;
an input stage, having at least two transistors coupled in a first differential pair configuration and having the magnetoresistive sensor coupled between the bases thereof, and coupled to the first constant current source, for amplifying voltage deviations from said constant time average value of the voltage across said magnetoresistive sensor;
output stage, coupled to the input stage, for amplifying and transmitting signals received from the input stage; and
feedback means, coupled from the output stage to the input stage, for correcting variations in said bias voltage levels.

7. The circuit as in claim 6 wherein the collectors and bases of the said first differential pair of transistors are coupled to the feedback means, and the emitters of said first differential pair are coupled to the first constant current source.

8. A circuit as in claim 6 wherein the feedback means includes:
at least two transistors coupled in a second differential pair configuration for correcting the voltage at the bases of the first differential pair; and
first and second follower transistors, coupled to the first differential pair, for coupling the variations in the voltage levels produced in the input stage to the second differential pair;
said second differential pair being coupled to a second constant current source, and said follower transistors being coupled to third and fourth constant current sources, respectively.

9. A circuit as in claim 6 further including:
a plurality of input stages; and
selection means for activating one of the plurality of input stages and deactivating all of the remaining plurality of input stages.

10. The circuit as in claim 6 wherein the output stage comprises two resistors having substantially equal resistance value.

11. The circuit as in claim 6 wherein the current flowing in each transistor of the first differential pair is substantially equal.

12. The circuit as in claim 6 wherein the feedback means includes frequency setting means for setting the frequency response of the circuit.

13. The circuit as in claim 12 wherein the frequency setting means is a capacitor.

14. The circuit as in claim 6 further including feedforward means, coupled to the input and output stages, for controlling the DC offset voltage at the output of the output stage.

15. A circuit as in claim 6 wherein:
the input stage further includes an emitter resistor coupled between the emitters of said differential pair, the emitter of one of said differential pair being coupled to the first constant current source; and
said bias voltage being referenced to a voltage produced by a current from said first constant current source flowing through said emitter resistor.

16. The circuit as in claim 15 wherein the current flowing in each of the emitters of said differential pair is substantially equal.

17. The circuit as in claim 15 further including settling means for reducing the time required for said circuit to settle into steady-state operation after one of said plurality of input stages is deactivated and another of said input stages is activated or after activating any input stage.

18. The circuit as in claim 17 wherein the settling means comprise control means for temporarily increasing the available output drive current of said feedback means during activation of any of said plurality of input stages.

19. The circuit as in claim 17 wherein the settling means comprises first and second comparator means coupled to the output of said input stage for controlling the DC offset voltage thereat in response to a change in such DC offset voltage during deactivation of one and activation of another input stage.

20. Apparatus as in claim 9 wherein said selection means is effective for deactivating all of said input stages.

* * * * *